(12) United States Patent
Stojetz et al.

(10) Patent No.: US 9,048,630 B2
(45) Date of Patent: Jun. 2, 2015

(54) SEMICONDUCTOR LASER DIODE

(71) Applicant: OSRAM Opto Semiconductors GmbH, Regensburg (DE)

(72) Inventors: Bernhard Stojetz, Wiesent (DE); Alfred Lell, Maxhuette-Haidhof (DE); Christoph Eichler, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 145 days.

(21) Appl. No.: 14/031,991

(22) Filed: Sep. 19, 2013

(65) Prior Publication Data

US 2014/0133504 A1    May 15, 2014

(30) Foreign Application Priority Data

Sep. 27, 2012  (DE) .......... 10 2012 109 175

(51) Int. Cl.
*H01S 5/00* (2006.01)
*H01S 5/20* (2006.01)
*H01S 5/02* (2006.01)
*H01S 5/065* (2006.01)

(52) U.S. Cl.
CPC ............ *H01S 5/2022* (2013.01); *H01S 5/0207* (2013.01); *H01S 5/0653* (2013.01); *H01S 2301/17* (2013.01)

(58) Field of Classification Search
CPC ..... H01S 5/10; H01S 2301/17; H01S 5/0653; H01S 5/2022

USPC ............ 372/44.01, 50.11, 45.013; 250/338.1
See application file for complete search history.

(56) References Cited

U.S. PATENT DOCUMENTS

| | | | |
|---|---|---|---|
| 7,271,419 B2 * | 9/2007 | Behringer et al. | 257/88 |
| 2005/0014300 A1 * | 1/2005 | Welch et al. | 438/17 |
| 2005/0269584 A1 | 12/2005 | Hasegawa et al. | |
| 2013/0230067 A1 | 9/2013 | Eichler et al. | |

FOREIGN PATENT DOCUMENTS

| | | |
|---|---|---|
| DE | 19963807 A1 | 7/2001 |
| DE | 102006046297 A1 | 4/2008 |
| DE | 102008012859 A1 | 11/2009 |
| DE | 102010015197 A1 | 1/2012 |
| DE | 102011054954 A1 | 5/2013 |
| JP | 11-224969 A | 8/1999 |
| JP | 2001-148545 A | 5/2001 |

* cited by examiner

*Primary Examiner* — Tuan Nguyen
(74) *Attorney, Agent, or Firm* — Slater & Matsil, L.L.P.

(57) ABSTRACT

A semiconductor laser diode includes a substrate. A semiconductor layer sequence on the substrate has at least one active layer designed for generating laser light that is emitted along an emission direction during operation. At least one filter layer has a main extension plane that is parallel to a main extension plane of the active layer and that is designed to scatter and/or absorb light that propagates in the semiconductor layer sequence and/or the substrate in addition to the laser light.

18 Claims, 11 Drawing Sheets

SEMICONDUCTOR LASER DIODE

This application claims priority to German Patent Application 10 2012 109 175.7, which was filed Sep. 27, 2012, and is incorporated herein by reference.

TECHNICAL FIELD

A semiconductor laser diode is specified.

BACKGROUND

In edge emitting laser diodes, the carrier substrate or growth substrate of which is at least partly transparent to a radiation generated, as is the case for example, for blue or green emitting InGaN laser diodes on GaN substrates, scattered light of the laser mode and spontaneously emitted light can propagate in the substrate. If this light emerges from the coupling-out facet, which can be designated as substrate light emission, the beam quality of the emitted laser radiation decreases since the radiation no longer emerges from a single, point-like region at the coupling-out facet and, consequently, the ideal Gaussian emission characteristic of the laser is disturbed. Particularly when such laser diodes are used in laser projectors with so-called flying spot technology, the disturbing emission from the substrate gives rise to undesirable imaging aberrations in the projected image, for example, as a result of a disturbing bright and un-sharp image edge around the projected image.

In order to reduce the substrate light emission, a laser diode can be mounted for example, on a heat sink or a housing such that the coupling-out facet is offset toward the rear with respect to a front edge of the heat sink. As a result, part of the light emitted by the coupling-out facet is masked out by that part of the heat sink which is arranged in front of the coupling-out facet. However, only a small part of the substrate light emission can be reduced by this means, since said substrate light emission is emitted from the entire substrate. Moreover, the laser power, that is to say the power of the desirably emitted laser light, is also undesirably reduced as a result.

SUMMARY OF THE INVENTION

In accordance with at least one embodiment, a semiconductor laser diode comprises a substrate, on which a semiconductor layer sequence having at least one active layer designed for generating laser light is applied. The laser light is emitted along an emission direction from the semiconductor layer sequence. The laser light can correspond in particular to one desired laser mode or a plurality of desired laser modes generated in the active layer.

Furthermore, the semiconductor laser diode comprises a filter layer, which has a main extension plane which is parallel to the main extension plane of the active layer and which is designed to scatter and/or absorb light which propagates in the semiconductor layer sequence and/or the substrate in addition to the laser light.

In order to produce the semiconductor laser diode, the semiconductor layer sequence having at least one active layer can be grown epitaxially on a growth substrate. The growth substrate can preferably be an at least partly transparent substrate which is at least partly transmissive to the light generated in the active layer during the operation of the semiconductor laser diode. Preferably, the growth substrate is formed by a GaN substrate or by a sapphire substrate. The epitaxial growth can be effected, for example, by means of metal organic vapor phase epitaxy (MOVPE) or molecular beam epitaxy (MBE).

The semiconductor layer sequence is preferably based on a III-V compound semiconductor material. The semiconductor material is for example a nitride compound semiconductor material such as $Al_xIn_{1-x-y}Ga_yN$ or a phosphide compound semiconductor material such as $Al_xIn_{1-x-y}Ga_yP$ or else an arsenide compound semiconductor material such as $Al_xIn_{1-x-y}Ga_yAs$, wherein in each case $0 \leq x \leq 1$, $0 \leq y \leq 1$ and $x+y \leq 1$ hold true. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are indicated, even if these can be replaced and/or supplemented in part by small amounts of further substances.

The semiconductor layer sequence comprises the at least one active layer designed for generating an electromagnetic radiation, that is to say in particular laser light in an ultraviolet to infrared wavelength range. The active layer comprises in particular at least one pn junction or, preferably, one or a plurality of quantum well structures. The laser light generated by the active layer during operation is in particular in the spectral range between 380 nm and 550 nm inclusive or between 420 nm and 540 nm inclusive.

Furthermore, it is also possible for the growth substrate to be replaced by a carrier substrate, which is different than the growth substrate. For this purpose, after being grown on a growth substrate, the semiconductor layer sequence is preferably transferred to the carrier substrate in the wafer assemblage. Hereinafter, "substrate" can denote a growth substrate or a carrier substrate, depending on the way in which the semiconductor laser diode is produced.

Furthermore, a front facet is formed at the semiconductor layer sequence and the substrate. The front facet is formed for example after the semiconductor layer sequence has been grown epitaxially onto a growth substrate. The front facet is produced in particular by the growth substrate on which the semiconductor layer sequence has been applied being divided, for example, by means of cleaving. It is likewise possible for the front facet to be produced by etching. A projection can then be formed at the substrate and/or at the semiconductor layer sequence. Furthermore, a rear-side facet can also be formed at an opposite side of the semiconductor layer sequence and of the substrate relative to the front facet, wherein a method such as that used for producing the front facet can be used for this purpose.

In particular, the semiconductor laser diode can be an edge emitting laser, for example, a so-called stripe laser, a ridge waveguide laser, a trapezoidal laser or a combination thereof. In such semiconductor laser diodes, the front facet and also the rear-side facet are formed by side faces of the semiconductor layer sequence and of the substrate which are preferably arranged perpendicular to the extension direction of the semiconductor layers of the semiconductor layer sequence. The active layer can have an active region, for example, which is formed by a part of the active layer and in which the laser light is generated. Depending on the design of the semiconductor laser diode, the semiconductor layer sequence can thus have an active region comprising the entire or else only a part of the active layer. Furthermore, the semiconductor laser diode can be embodied as laser bar which has active regions in the active layer laterally alongside one another, that is to say in a direction parallel to the main extension plane of the active layer, via which active regions laser light can in each case be emitted during operation.

The front facet is designed as a main emission face with a light emission region for the laser light generated in the completed semiconductor laser diode. This can mean, for example, that the front facet as the sole side of the semiconductor laser diode is designed to emit the light generated in the active region of the semiconductor layer sequence during operation. The light emission region of the front facet denotes in particular that region of the front facet via which the produced laser light desired in the active region during the operation of the semiconductor laser diode is emitted intentionally, that is to say, for example, a region in which a fundamental mode of the laser light reaches the front facet. The light emission region is formed in particular by a partial zone of the semiconductor layer sequence and/or by a partial zone of the substrate near the semiconductor layer sequence and therefore lies in or near a region of the front facet in which the active region of the active layer also lies. On the front facet and also on the rear-side facet, it is possible to apply in each case one or a plurality of passivation layers and/or an optical coating in the form of a reflective or antireflective coating of the facets.

In particular, the at least one filter layer can be deliberately incorporated into the semiconductor laser diode in order that the laser fundamental mode which can correspond to the emitted laser light is influenced as little as possible or not at all, whereas the so-called substrate mode, which can comprise disturbing scattered light and/or light generated spontaneously in the active layer, is damped and/or diffusely scattered at the filter layer, as a result of which only a small part of this light or even no part of this light at all can leave the semiconductor laser diode. As a result, the beam quality can be considerably improved. The filter layer can preferably be arranged above and/or below the light emission region in a vertical direction corresponding to the growth direction of the semiconductor layer sequence.

In accordance with a further embodiment, the filter layer has a roughening on the opposite side of the substrate relative to the semiconductor layer sequence, which side can also be designated as the substrate underside. While a reflection in particular of the scattered light propagating in the substrate can take place at a substrate underside which in the prior art is usually smooth and often also polished or embodied in a mirroring fashion, for example, as a result of a metallization, a roughened substrate underside brings about a diffuse reflection and can furthermore also cause a partial absorption of the scattered light. In this regard, as a result of a roughening of the opposite underside of the substrate relative to the semiconductor layer sequence, disturbing reflections of the substrate mode can be eliminated and disturbing structures in the far field can thus be reduced, as the inventors were able to demonstrate in corresponding experiments. Furthermore, an electrode layer for making electrical contact with the semiconductor layer sequence can be applied on the roughening.

The roughening can preferably have a mean roughness $R_q$ of greater than or equal to 1 nm or else greater than or equal to 100 nm or else greater than or equal to 500 nm. Here and hereinafter, the mean roughness $R_q$ denotes the root-mean-square roughness. Furthermore, the mean roughness $R_q$ of the roughening can have a value of less than or equal to 30 μm or else less than or equal to 20 μm or else less than or equal to 10 μm. In particular, the roughening of the underside of the substrate can have a mean roughness $R_q$ of greater than or equal to 1 nm and less than or equal to 30 μm, preferably of greater than or equal to 100 nm and less than or equal to 20 μm, and particularly preferably of greater than or equal to 500 nm and less than or equal to 10 μm. The roughening is particularly effective if the mean roughness $R_q$ is in the range of the optical wavelength of the light generated by the active layer in the material of the semiconductor layer sequence and/or of the substrate.

In accordance with a further embodiment, the filter layer is formed by the roughening. In other words, the at least one filter layer in this case consists of the roughening of the substrate underside.

In accordance with a further embodiment, the semiconductor layer sequence has as at least one filter layer a roughening on the opposite side of the substrate relative to the semiconductor layer sequence and an absorber layer on the roughening. In particular, it is possible to apply the material of the absorber layer, said material being described below in accordance with further embodiments, on the roughening on the substrate underside by means of a physical or chemical deposition method, for example, by vapor deposition, sputtering, chemical vapor deposition, ion plating and/or atomic layer deposition. Furthermore, the absorber layer on the roughening can also be formed by an electrode layer which is applied on the underside of the substrate facing away from the semiconductor layer sequence and which serves for making electrical contact with the semiconductor layer sequence. In this case, the electrode layer is formed as part of the at least one filter layer and comprises an absorbent material described further below.

In accordance with a further embodiment, the at least one filter layer has at least one absorber layer. In comparison with the previous embodiment, the at least one filter layer can also have only at least one or a plurality of absorber layers without a roughening of the underside of the substrate. By way of example, the TM-polarized coherent scattered light can be at least partly absorbed by the absorber material of the at least one absorber layer.

In particular, the at least one filter layer can have an absorber layer arranged over the whole area. That can mean, in particular, that the at least one absorber layer projects over a large area and without openings from the front facet toward the rear-side facet and toward all side faces of the semiconductor laser diode. If such a large-area absorber layer is arranged between an electrode layer for making contact with the semiconductor layer sequence and the active layer, the absorber layer comprises an electrically conductive material in order to enable a current flow between the active layer and the electrode layer through the absorber layer.

In accordance with a further embodiment, the absorber layer is arranged on the opposite side of the substrate relative to the semiconductor layer sequence, that is to say on the substrate underside. By way of example, in this case the absorber layer can be situated between the substrate and an electrode layer for making electrical contact with the semiconductor layer sequence. As an alternative thereto, the electrode layer can also be formed by the absorber layer. Furthermore, the at least one absorber layer can also be situated within the substrate. Furthermore, it is also possible for the at least one absorber layer to be applied on the side of the substrate facing the semiconductor layer sequence, that is to say between the substrate and the semiconductor layer sequence.

In accordance with a further embodiment, the substrate is embodied as the at least one absorber layer. As a result of this it can be possible that any propagation of scattered radiation or some other radiation promoting a substrate mode in the substrate can be suppressed.

In accordance with a further embodiment, the at least one absorber layer is arranged in the semiconductor layer sequence. By way of example, the absorber layer can be arranged between the substrate and the active layer in the semiconductor layer sequence. In this case, it can be particularly advantageous if the absorber layer is arranged between a cladding layer of the semiconductor layer sequence and the substrate. In particular, an n-doped cladding layer can be involved in the case of a customary growth order of the semiconductor layer sequence. Furthermore, it is also possible for the at least one absorber layer to be arranged on the opposite side of the active layer relative to the substrate in the semiconductor layer sequence. By way of example, the at least one absorber layer can be arranged on the opposite side of the semiconductor layer sequence relative to the substrate. In this case, it can also be possible that the at least one absorber layer is simultaneously embodied as an electrode layer for making contact with the semiconductor layer sequence.

In accordance with a further embodiment, the at least one absorber layer is structured. That can mean, in particular, that the at least one absorber layer has partial regions separated from one another along the main extension plane of the filter layer. By way of example, the at least one absorber layer can be structured in a direction along the emission direction and thus have along the emission direction at least two or more partial regions separated from one another. Furthermore, it is also possible that the at least one absorber layer is structured in a direction perpendicular to the emission direction and thus has in a direction perpendicular to the emission direction at least two or more partial regions separated from one another. Furthermore, it can also be possible that a structured absorber layer only has a continuous region, which, however, is spaced apart from the front facet, rear-side facet and/or side faces of the semiconductor laser diode. A structured embodiment of the at least one absorber layer can be advantageous in particular if the material of the at least one absorber layer is electrically insulating or only poorly electrically conducting and the at least one absorber layer is situated between an electrode layer and the semiconductor layer sequence. However, a structured design of the absorber layer is also possible in the case of electrically conductive absorber materials.

In accordance with a further embodiment, at least two absorber layers structured into partial regions in each case are present and the partial regions are arranged in a manner offset with respect to one another. That means in other words that two absorber layers are present in two different planes, which absorber layers are structured in each case into at least one or a plurality of regions, and these regions do not overlap (at least do not all completely overlap) when one absorber layer is projected along a vertical direction onto the other absorber layer.

In accordance with a further embodiment, the filter layer has at least two or more absorber layers which can be embodied such that they are either all large-area and unstructured, all structured or else in part large area and unstructured and structured. In this case, the two or more absorber layers can be arranged according to the abovementioned embodiments in the substrate, on the substrate, within the semiconductor layer sequence and/or on the semiconductor layer sequence. In particular, the at least two absorber layers can be arranged one above another in a vertical direction, that is to say in a direction along the growth direction of the semiconductor layer sequence. Furthermore, at least two or more absorber layers can be present which have different absorption coefficients, different refractive indices and/or different electrical conductivities.

In accordance with a further embodiment, the at least two absorber layers are embodied identically. By way of example, two identically embodied absorber layers can be situated in or on the substrate.

In accordance with a further embodiment, the at least two absorber layers are embodied differently. This makes it possible to combine the respective advantages of different absorber layers or absorber materials with one another.

In accordance with a further embodiment, the at least one absorber layer is arranged in a maximum of the substrate mode. Since the efficiency of an absorber layer is crucially dependent on the thickness thereof and the position thereof in the semiconductor laser diode and the waveguide formed by the semiconductor layer sequence and the substrate, the effect of the absorber layer on the substrate mode is highest if the absorber layer is placed into an intensity maximum of as many undesirable laser modes as possible and/or into an intensity maximum of a scattered light. The optimum position and also the optimum thickness can be determined by means of measurement and/or simulation. In particular, intensity maxima of the substrate mode in the semiconductor laser diode can be present in the vicinity of jumps in the refractive index, as can be the case, for example, upon the transition from the substrate to an electrode layer arranged on the underside of the substrate, or upon the transition from the semiconductor layer sequence to an electrode layer arranged on the semiconductor layer sequence, since most modes have an oscillation node there.

The magnitude of the absorption coefficient and of the refractive index and also the thickness of the at least one absorber layer have a crucial influence on the effectiveness of the at least one absorber layer, as can be shown for example with the aid of simulations. In order to minimize the intensity of the substrate mode, the at least one absorber layer should enable the highest possible damping of disturbing radiation. In particular, it can be advantageous if the at least one absorber layer has an absorption coefficient of greater than or equal to $100\ cm^{-1}$ or else greater than or equal to $500\ cm^{-1}$ or else greater than or equal to $1{,}000\ cm^{-1}$. The absorption coefficient of the at least one absorber layer can be in particular also less than or equal to $50{,}000\ cm^{-1}$ or else less than or equal to $10{,}000\ cm^{-1}$. In particular, the absorption coefficient of the absorber layer can be greater than or equal to $500\ cm^{-1}$ and less than or equal to $50{,}000\ cm^{-1}$, and particularly preferably greater than or equal to $1{,}000\ cm^{-1}$ and less than or equal to $10{,}000\ cm^{-1}$. The thickness of the at least one absorber layer can be greater than or equal to 1 nm or else greater than or equal to 10 nm or else greater than or equal to 100 nm and less than or equal to 200 µm or else less than or equal to 10 µm or else less than or equal to 2 µm. In particular, the absorber layer can have a thickness of greater than or equal to 1 nm and less than or equal to 200 µm, preferably of greater than or equal to 10 nm and less than or equal to 10 µm, and particularly preferably of greater than or equal to 100 nm and less than or equal to 2 µm. Furthermore, it is particularly advantageous if the refractive index of the at least one absorber layer is greater than that of the substrate. In particular, the refractive index of the at least one absorber layer is greater than or equal to 70% of the refractive index of the substrate, preferably greater than or equal to 80%, and particularly preferably greater than or equal to 90%. Consequently, the refractive index of the at least one absorber layer should be more than 70% of that of the substrate, preferably more than 80%, and particularly preferably more than 90%.

Examples of appropriate materials for the at least one absorber layer include metals, for instance titanium, platinum, nickel, palladium, chromium, aluminum, gold, silver, copper, niobium, TiWN and combinations thereof. Furthermore, semiconductor materials are suitable which have a smaller band gap than the energy of the light generated in the active layer, for example silicon, germanium, $Al_xIn_yGa_{1-x-y}N$, $Al_xIn_yGa_{1-x-y}As$, $Al_xIn_yGa_{1-x-y}P$ (where x, y are in each case greater than or equal to 0 and less than or equal to 1), indium tin oxide, ZrO, ZnO, ZnSe, CdTe and combinations thereof. The semiconductor material can also be doped in order to set the absorption properties.

In accordance with a further embodiment, the at least one absorber layer in the form of an amorphous or polycrystalline layer is applied to a surface of the substrate or of the semiconductor layer sequence by means of a physical or chemical deposition method. In particular, the at least one absorber layer can comprise a material applied by vapor deposition, sputtering, chemical vapor deposition, ion plating and/or atomic layer deposition and selected from AlInGaN, Si, Ge, indium tin oxide, Ni, Cr, Ti, Nb, Pd, Pt, Au, Ag, Cu, Al, ZnO, TiWN.

In accordance with a further embodiment, the at least one absorber layer can be deposited epitaxially between the substrate and the semiconductor layer sequence or as a layer of the semiconductor layer sequence. In particular, the at least one absorber layer can be grown epitaxially with one or more materials selected from AlInGaN, AlinGaAs, AlInGaP, Si, Ge, ZrO, ZnO, ZnSe, CdTe.

In accordance with a further embodiment, for forming the at least one absorber layer, one or a plurality of materials are introduced by implantation or diffusion. By way of example, a material such as, for instance, nitrogen, phosphorus, oxygen, magnesium, silicon, germanium, boron, hydrogen or combinations thereof can be suitable for this purpose. The materials mentioned can be introduced into the substrate and/or the semiconductor layer sequence.

In accordance with a further embodiment, the semiconductor laser diode comprises at least two filter layers. Each of the filter layers can be embodied in accordance with one or more of the abovementioned embodiments. By way of example, identically embodied filter layers can be arranged at different locations in the semiconductor laser diode or different filter layers can be present.

BRIEF DESCRIPTION OF THE DRAWINGS

Further advantages, advantageous embodiments and developments will become apparent from the exemplary embodiments described below in conjunction with the figures.

In the exemplary embodiments and figures, elements that are identical, of identical type or act identically may in each case be provided with the same reference signs. The illustrated elements and their size relationships among one another should not be regarded as true to scale; rather, individual elements such as, for example, layers, structural parts, components and regions may be illustrated with an exaggerated size in order to enable better illustration and/or in order to afford a better understanding.

DETAILED DESCRIPTION OF ILLUSTRATIVE EMBODIMENTS

Figure 1A:
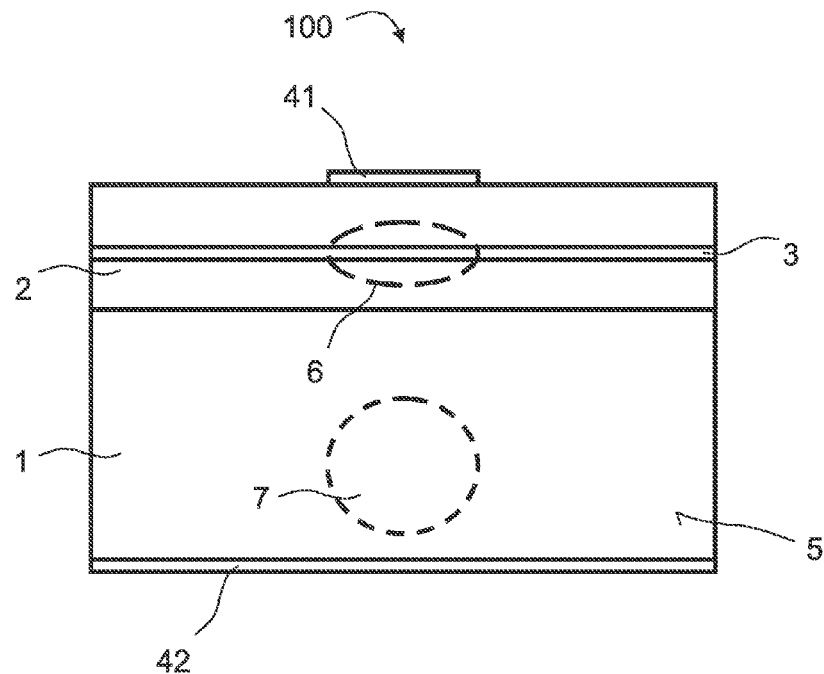
FIGS. 1A and 1B show schematic illustrations of a semiconductor laser diode for generating laser light in accordance with one exemplary embodiment.
Figure 1B:
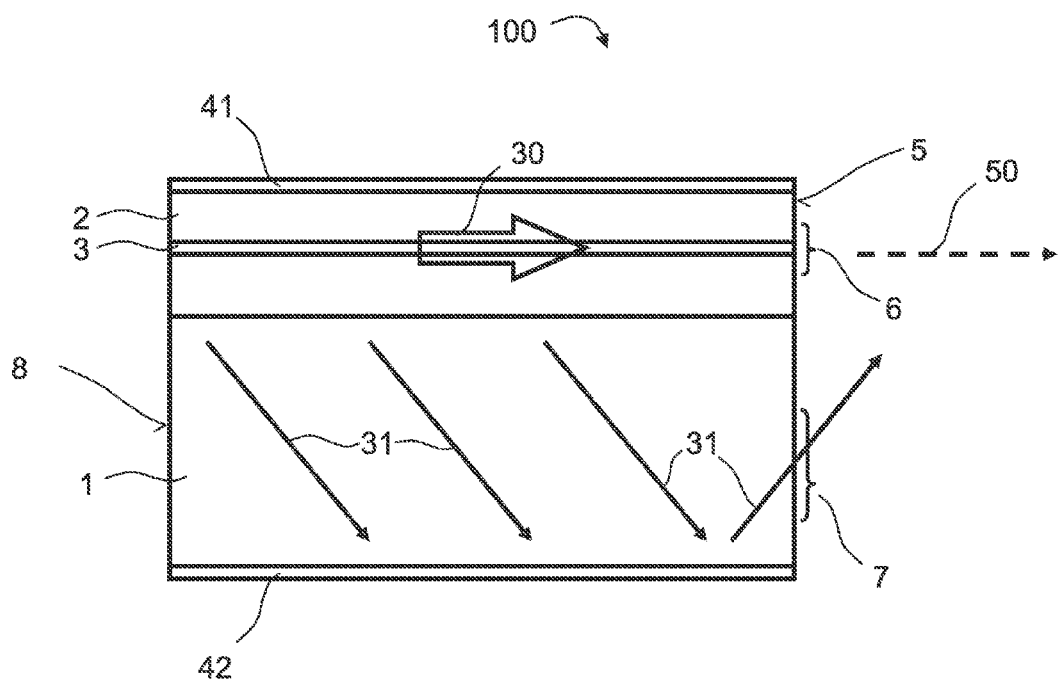

FIGS. 1A and 1B show a semiconductor laser diode 100 for generating laser light, wherein FIG. 1A shows a plan view of the front facet 5 perpendicular to the emission direction 50 of the laser light 30 and FIG. 1B shows a sectional illustration through the semiconductor laser diode 100 perpendicular to the front facet 5.

The semiconductor laser diode 100 comprises a substrate 1, which is preferably a growth substrate for the semiconductor layer sequence 2 grown epitaxially thereon, for example GaN or sapphire. As an alternative thereto, the substrate 1 can also be a carrier substrate to which the semiconductor layer sequence 2 grown on a growth substrate was transferred after growth.

Particularly preferably, the substrate 1 of the semiconductor laser diode 100 can be composed of GaN on which a semiconductor layer sequence 2 containing an AlInGaN compound semiconductor material is grown.

The semiconductor layer sequence 2 has an active layer 3 suitable for generating laser light 30 during operation. If the semiconductor layer sequence 2, as described above, is grown on the substrate 1, that side of the semiconductor layer sequence 2 which faces the substrate 1 as seen from the active layer 3 is usually n-doped, while that side of the semiconductor layer sequence 2 which faces away from the substrate 1 is p-doped. The individual layers of the semiconductor layer sequence 2 in addition to the active layer 3, such as, for instance, cladding layers, waveguide layers, semiconductor contact layers, barrier layers, current spreading layers and/or current limiting layers, are not shown in order to simplify the illustration.

An electrode layer 41 is applied at a side of the semiconductor layer sequence 2 which faces away from the substrate 1, said electrode layer being provided for making electrical contact with the top side of the semiconductor layer sequence 2. The semiconductor laser diode 100 comprises a further electrode layer 42 for making electrical contact with the underside of the semiconductor layer sequence 2 on that side of the substrate 1 which faces away from the semiconductor layer sequence 2, which side hereinafter is also designated as substrate underside. The designations "top side" as that side of the semiconductor layer sequence 2 which faces away from the substrate 1 and "underside" as that side of the substrate 1 which faces away from the semiconductor layer sequence 2 are used regardless of the orientation of the semiconductor laser diode 100 in which the latter can be mounted on a carrier. The electrode layer 41 or the electrode layer 42 can simultaneously serve as a mounting area for mounting the semiconductor laser diode 100 on a carrier such as, for example, a heat sink and/or a housing, such that the semiconductor laser diode 100 in other words can be mounted on a carrier by the top side or by the underside.

If an electrically insulating substrate such as sapphire, for example, is used instead of an electrically conductive substrate, the further electrode layer 42 can also be arranged on that side of the substrate which faces the semiconductor layer sequence 2, for example, in a depression in the semiconductor layer sequence 2 which extends from the top side of the semiconductor layer sequence 2 through the active layer 3 as far as that side of the semiconductor layer sequence 2 which faces the substrate as seen from the active layer 3.

After the growth of the semiconductor layer sequence 2, a front facet 5 and a rear-side facet 8 are formed at the substrate 1 and the semiconductor layer sequence 2. The laser light generated during the operation of the semiconductor laser diode 100, said laser light being indicated by the arrow 30, emerges at the front facet 5 in a light emission region 6 and is emitted along the emission direction 50. The light emission region 6 comprises a region at the front facet 5 which preferably corresponds to an exit area of the desired laser mode generated in the semiconductor layer sequence 2, which laser mode can be formed by a fundamental mode, for example. On the front facet 5, at least in the light emission region 6, it is possible to apply a passivation (not shown) and/or an optical coating (not shown) which is embodied as partly reflective coating or as antireflection coating and couples out a desired part of the laser light 30 generated in the active layer 3 from the semiconductor layer sequence 2 for emission. The light emission region 6 is situated in particular opposite a region at the rear-side facet 8 of the growth substrate 1 and the semiconductor layer sequence 2 on which an optical coating in the form of a resonator minor is applied (not shown). Furthermore, a passivation can also be applied (not shown) on the rear-side facet 8.

The semiconductor laser diode 100 shown is an edge emitting semiconductor laser diode which can be embodied as a stripe laser, trapezoidal laser, ridge waveguide laser or a combination thereof. Furthermore, the semiconductor laser diode 100 can also be embodied as a laser bar.

On account of spontaneous emission, of scattered radiation and/or on account of an overlap of an electric field of the laser mode with the substrate 1, light outside the actual desired laser mode of the laser light 30 can pass into the growth substrate 1. This light is also designated as substrate mode and is indicated by the arrows bearing the reference sign 31 in FIG. 1B. If the laser light 30 is blue or green light, then in particular GaN, which is at least partly transparent to the laser light 30, is used as substrate 1 as described above. As a result, it is possible that light of the substrate mode 31 can propagate in the substrate 1 substantially without being impeded. This light, if it reaches the front facet 5, can be emitted via a secondary emission region 7 and is usually polarized partly parallel and partly perpendicularly to the laser light 30, that is to say the main light beam. In this case, the direction along which the substrate mode 31 is emitted usually deviates from the emission direction 50 of the laser light 30.

In comparison with the light emission region 6, the secondary emission region 7 can have a comparatively large area proportion on the front facet 5. In other words, the substrate 1 itself can appear as luminous and the beam quality of the actual desired laser radiation 30 which is emitted via the light emission region 6 can thereby be impaired.

If a semiconductor laser diode 100 such as is shown in FIGS. 1A and 1B is used without further measures for suppressing the emission of the substrate mode 31, then the near field of the emitted light has additional disturbing structures that lead to image aberrations, for example, in projection applications. By way of example, for image projection in the context of a flying spot application, the image to be generated is established by a moving micromirror. For optimum imagings, the light emitted by the semiconductor laser diode 100 has to be focused to a smallest possible point and in the near field, therefore, has to have an almost punctiform configuration in the form of a Gaussian emission characteristic. The greater the deviations from the Gaussian emission characteristic, the worse the focusability of the emitted light, as a result of which image aberrations can occur, for example, in the form of a bright image edge in the case of uniform illumination, since the disturbing structures in the near field lead to likewise disturbing additional structures in the far field.

If the semiconductor laser diode 100 is soldered onto a heat sink by the substrate underside, then the underside is embodied as reflective by polishing and/or, as is shown in FIGS. 1A and 1B, by means of a metallization in the form of the electrode layer 42, as a result of which further disturbing reflections of the near-field structures occur in the far field. Consequently, the substrate mode 31 leads to image aberrations, for example, in projection applications without suitable countermeasures.

FIGS. 2 to 15 show exemplary embodiments of semiconductor laser diodes which, in terms of their construction, correspond to the semiconductor laser diode 100 in FIGS. 1A and 1B and comprise at least one filter layer 9 for suppressing the substrate mode 31. The filter layers 9 are thus designed to scatter and/or absorb light which propagates in the semiconductor layer sequence 2 and/or the substrate 1 in addition to the desired laser light 30. The filter layers 9 each have a main extension plane which is parallel to a main extension plane of the active layer 3.

However, the following exemplary embodiments are not restricted to the construction of the semiconductor laser diode 100 as shown in FIGS. 1A and 1B.

The filter layers 9 in the following exemplary embodiments have roughenings 10 and/or absorber layers 11, 11' which are deliberately incorporated at different positions in the semiconductor laser diodes 101 to 114 shown.

In particular, the filter layers 9 are arranged in the region of the n-type contact, that is to say in the region of the electrode layer 42, on the substrate 1, in the substrate 1, in the semiconductor layer sequence 2 and in the region of the p-type contact, that is to say in the region of the electrode layer 41. In particular, it is also possible to incorporate a plurality of filter layers, in particular in the form of a plurality of absorber layers 11, 11'.

In addition to the respective position, geometry and structure of the filter layers 9 shown below, particularly in the case of filter layers 9 having one or a plurality of absorber layers 11, 11', the effectiveness can depend greatly on the material and the morphology of the absorber layer.

Examples of appropriate materials for the absorber layers 11, 11' shown below include metals, for instance titanium, platinum, nickel, palladium, chromium, aluminum, gold, silver, copper, niobium, TiWN and combinations thereof. Furthermore, semiconductor materials are suitable which have a smaller band gap than the energy of the light generated in the active layer, for example silicon, germanium, $Al_xIn_yGa_{1-x-y}N$, $Al_xIn_yGa_{1-x-y}As$, $Al_xIn_yGa_{1-x-y}P$ (where x, y are in each case between 0 and 1), indium tin oxide, ZrO, ZnO, ZnSe, CdTe and combinations thereof. The semiconductor material can also be doped in order to set the absorption properties.

By way of example, an absorber layer 11, 11' also in the form of an amorphous or polycrystalline layer can be applied to a surface of the substrate 1 or of the semiconductor layer sequence 2 by means of a physical or chemical deposition method, for example, by vapor deposition, sputtering, chemical vapor deposition, ion plating and/or atomic layer deposition. Particularly preferably, the absorber layers 11, 11' in such cases comprise one or more materials selected from AlInGaN, Si, Ge, indium tin oxide, Ni, Cr, Ti, Nb, Pd, Pt, Au, Ag, Cu, Al, ZnO, TiWN.

Furthermore, an absorber layer 11, 11' can also be deposited epitaxially between the substrate 1 and the semiconductor layer sequence 2 or as a layer of the semiconductor layer sequence 2. In particular, this can be effected by epitaxial deposition of one or more materials selected from AlInGaN, AlInGaAs, AlInGaP, Si, Ge, ZrO, ZnO, ZnSe, CdTe.

Furthermore, for forming an absorber layer 11, 11', a material can be introduced by implantation or diffusion into the substrate 1 and/or the semiconductor layer sequence 2. By way of example, a material such as, for instance, nitrogen, phosphorus, oxygen, magnesium, silicon, germanium, boron, hydrogen or combinations thereof can be suitable for this purpose.

Figure 16:
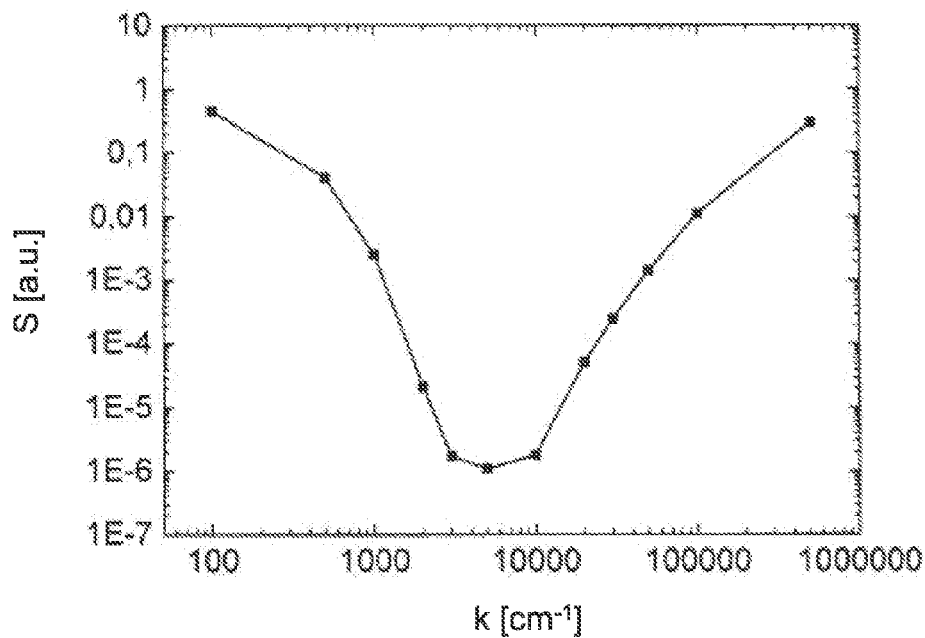
FIGS. 16 to 18 show simulations of parameters of absorber layers in accordance with further exemplary embodiments.
Figure 17:
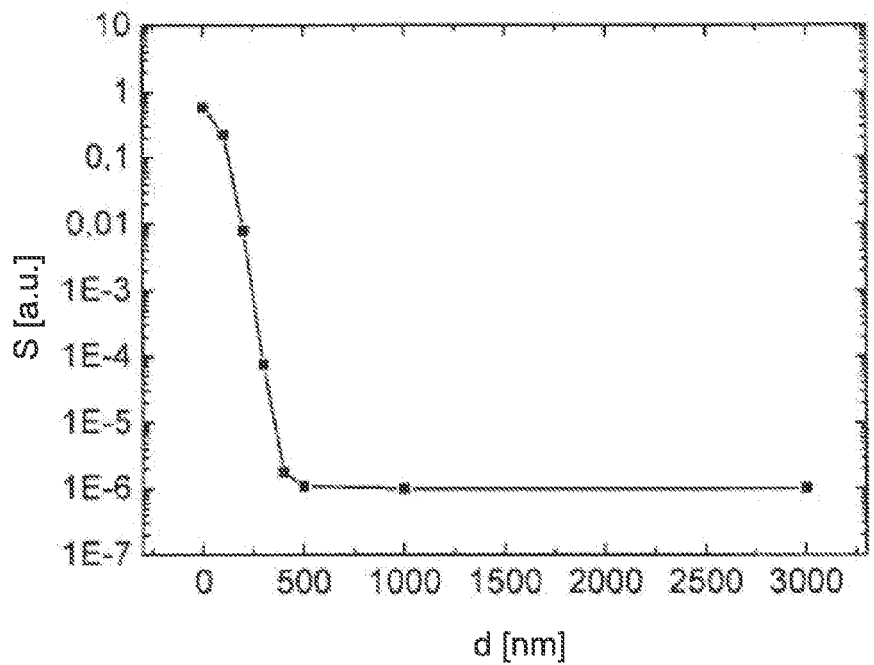
Figure 18:
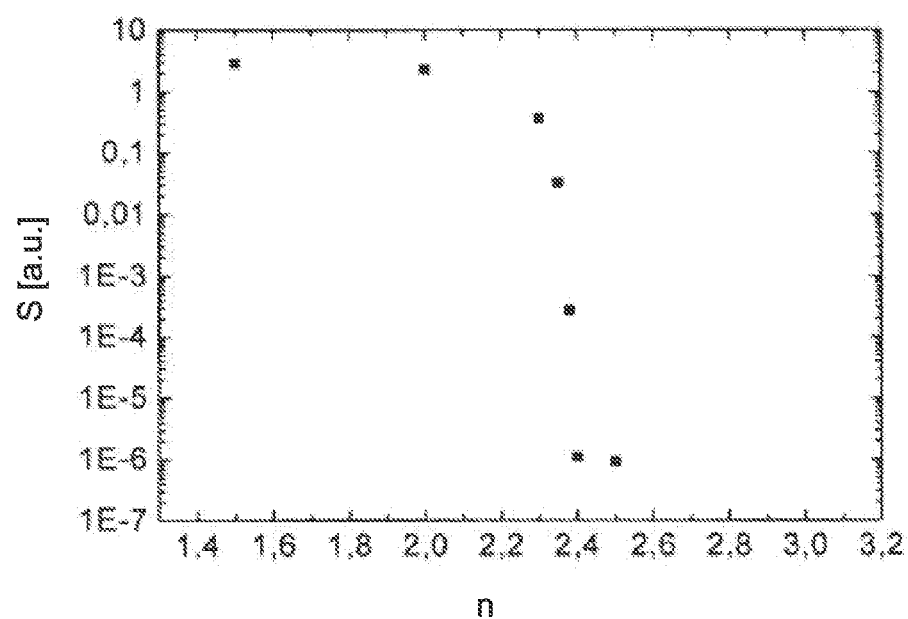

As is shown in FIGS. 16 to 18, the effectiveness of an absorber layer 11, 11' also depends on the absorption coefficient k, the thickness d and the refractive index n.

FIG. 16 shows a simulation of the substrate mode strength S (in arbitrary units), as a function of the absorption coefficient k (in $cm^{-1}$) of an absorber layer having a thickness d of 500 nm and a refractive index n of 2.4 on the n-doped side of the semiconductor laser diode. It can readily be discerned from the simulation that the absorption coefficient k of the absorber layer should be at least 100 $cm^{-1}$. Preferably, the absorption coefficient of the absorber layer 11, 11' is between 500 $cm^{-1}$ and 50,000 $cm^{-1}$ and particularly preferably between 1,000 $cm^{-1}$ and 10,000 $cm^{-1}$.

FIG. 17 shows a simulation of the substrate mode strength S (in arbitrary units) as a function of the thickness d (in nm) of an absorber layer 11, 11' having an absorption coefficient k of 5,000 $cm^{-1}$ and a refractive index n of 2.4 on the n-doped side of the semiconductor laser diode. It can be derived from the simulation that the thickness d of the absorber layer 11, 11' should be between 1 nm and 200 μm, preferably between 10 nm and 10 μm, and particularly preferably between 100 nm and 2 μm.

FIG. 18 shows a simulation of the substrate mode strength S (in arbitrary units) as a function of the refractive index n for an absorber layer 11, 11' having an absorption coefficient k of 5,000 $cm^{-1}$ and a thickness d of 500 nm on the n-doped side of the semiconductor laser diode. Taking account of the customary refractive indices of the substrates used in semiconductor laser diodes, it is evident therefrom that the refractive index of the absorber layer 11, 11' should be greater than that of the substrate, preferably at least more than 70%, particularly preferably more than 80% or even more than 90%.

The absorber layers 11, 11' described in the following exemplary embodiments can be embodied according to the previous embodiments.

If a plurality of absorber layers 11, 11' are present in the exemplary embodiments shown, then they can be embodied identically or differently. In particular, the absorber layers 11, 11' can be embodied differently in order to enable a combination of different absorption coefficients, refractive indices, conductivities and/or structurings.

Figure 2:
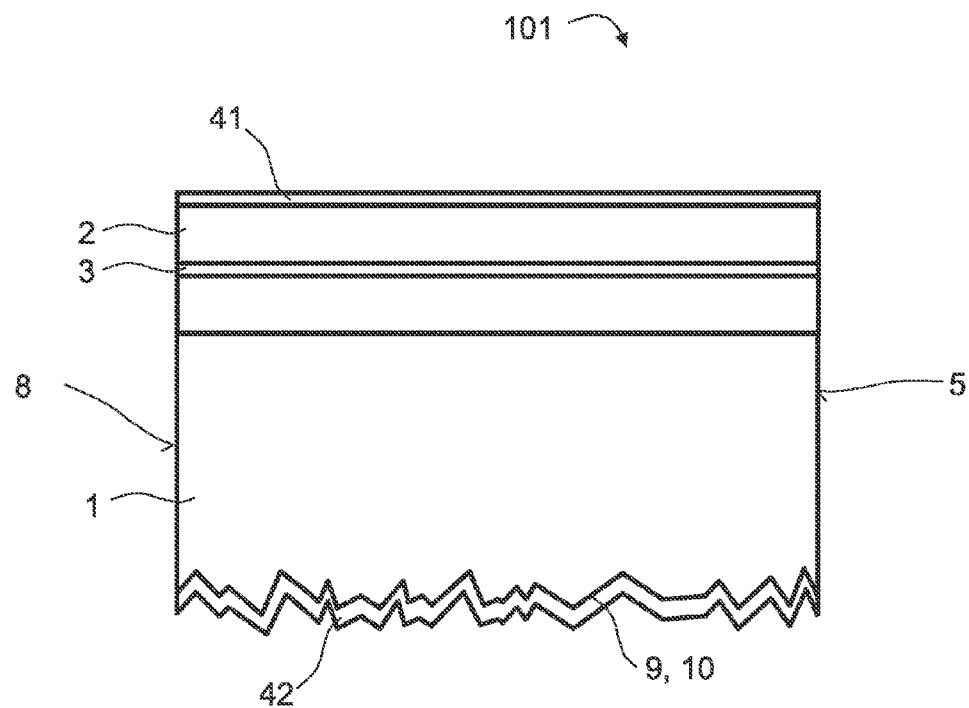
FIG. 2 shows a schematic illustration of a semiconductor laser diode in accordance with a further exemplary embodiment.

FIG. 2 shows a semiconductor laser diode 101 in accordance with one exemplary embodiment, comprising a roughening 10 as filter layer 9 on an opposite side of the substrate 1 relative to the semiconductor layer sequence 2, that is to say on the substrate underside. Such a roughening 10 as filter layer 9 makes it possible to prevent a specular reflection of scattered light at the electrode layer 42 for example, since only a diffuse reflection and a partial absorption of the scattered light can be possible by virtue of the roughening. In the abovementioned customary growth order of the semiconductor layer sequence 2, the n-type contact formed by the electrode layer 42 can thus be roughened.

In this case, the roughening 10 can have a mean roughness $R_q$, which denotes the root-mean-square roughness, which is greater than or equal to 1 nm and less than or equal to 30 μm, preferably greater than or equal to 100 nm and less than or equal to 20 μm, and particularly preferably greater than or equal to 500 nm and less than or equal to 10 μm, wherein the efficiency of the roughening 10 is particularly high if the mean roughness value is in the range of the optical wavelength of the light generated in the active layer 3 in the substrate material and/or the material of the semiconductor layer sequence 2.

In addition thereto, it can also be possible that the electrode layer 42 comprises an absorber material and can thus be embodied as an absorber layer of the filter layer 9.

Figure 3:
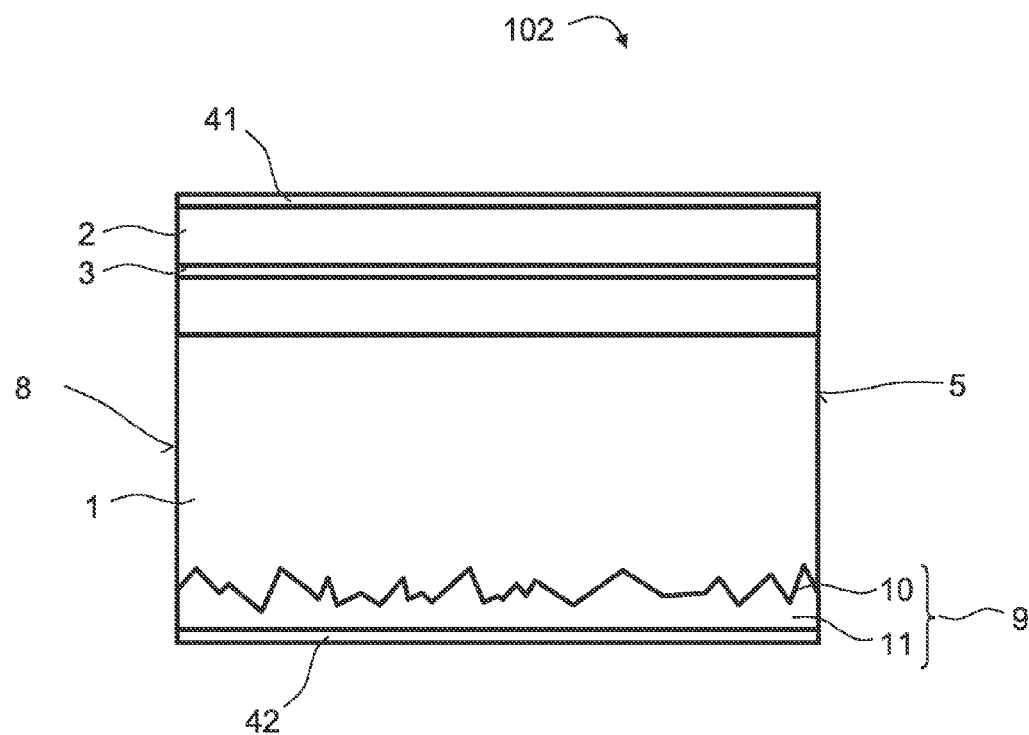
FIG. 3 shows a schematic illustration of a semiconductor laser diode in accordance with a further exemplary embodiment.

FIG. 3 shows a semiconductor laser diode 102 in accordance with a further exemplary embodiment, in which the filter layer 9 has a roughening 10 and also an absorber layer 11 on the roughening. In this case, the absorber layer 11 is selected deliberately with regard to its absorption properties, while an electrical connection can be effected via the electrode layer 42 applied on the absorber layer 11.

In the exemplary embodiments shown in FIGS. 2 and 3, in particular titanium or aluminum can be provided as material for the absorber layer. As an alternative thereto, some other material mentioned above can also be chosen as material for the at least one absorber layer.

Figure 4:
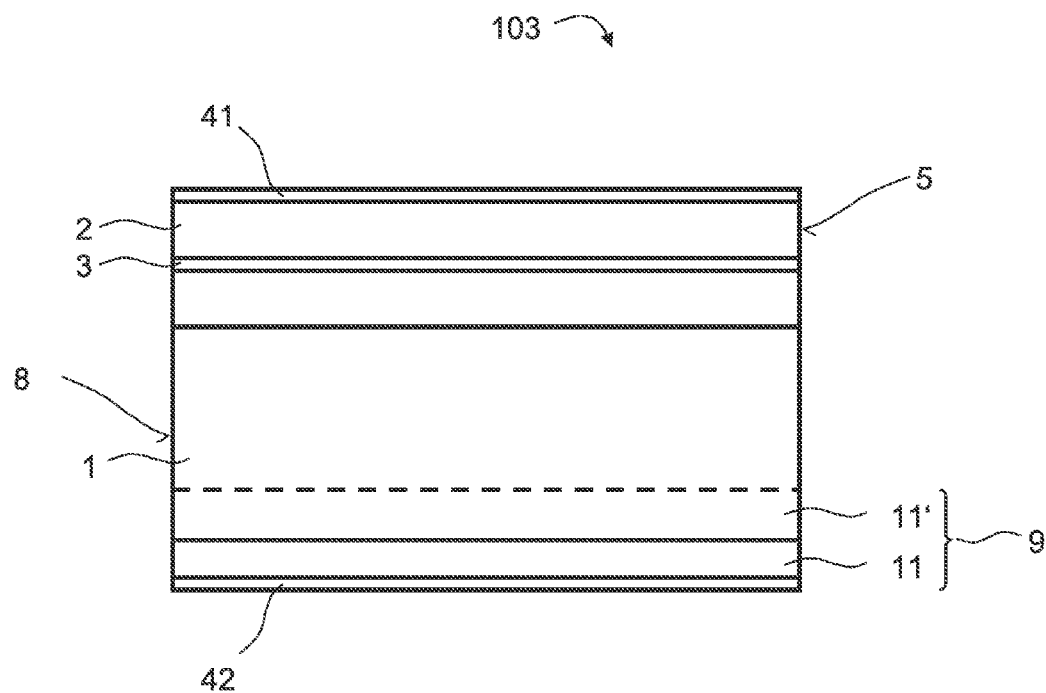
FIGS. 4 to 7 show schematic illustrations of semiconductor laser diodes in accordance with further exemplary embodiments.

FIG. 4 shows a semiconductor laser diode 103 in accordance with a further exemplary embodiment, comprising a filter layer 9 formed by an absorber layer 11 on the underside of the substrate, that is to say on that side of the substrate 1 which faces away from the semiconductor layer sequence 2. By way of example, the absorber layer can be formed by an indium tin oxide layer and/or a ZnO layer. Alternatively, other materials mentioned above are also possible for the absorber layer 11. An electrode layer 42 can be applied on the filter layer 9. As an alternative thereto, it is also possible for the electrode layer 42 to be formed by the filter layer 9.

Furthermore, the filter layer 9 can also have a further absorber layer 11' composed of a different material. By way of example, this enables a combination of an indium tin oxide layer and a ZnO layer as absorber layers 11, 11'.

The further absorber layer 11 can be situated in the form of a further filter layer 9 also within the substrate 1 instead of the arrangement at the underside of the substrate 1.

It can also be possible to produce at least one of the absorber layers 11, 11' for example, by implantation of one or more of the abovementioned materials into the substrate 1.

It is particularly advantageous if the filter layer 9 is arranged in a maximum of the substrate mode, which is situated in the vicinity of the electrode layer 42 on account of the jump in refractive index between the substrate 1 and the electrode layer 42, since most modes have an oscillation node at such a jump in refractive index.

Figure 5:
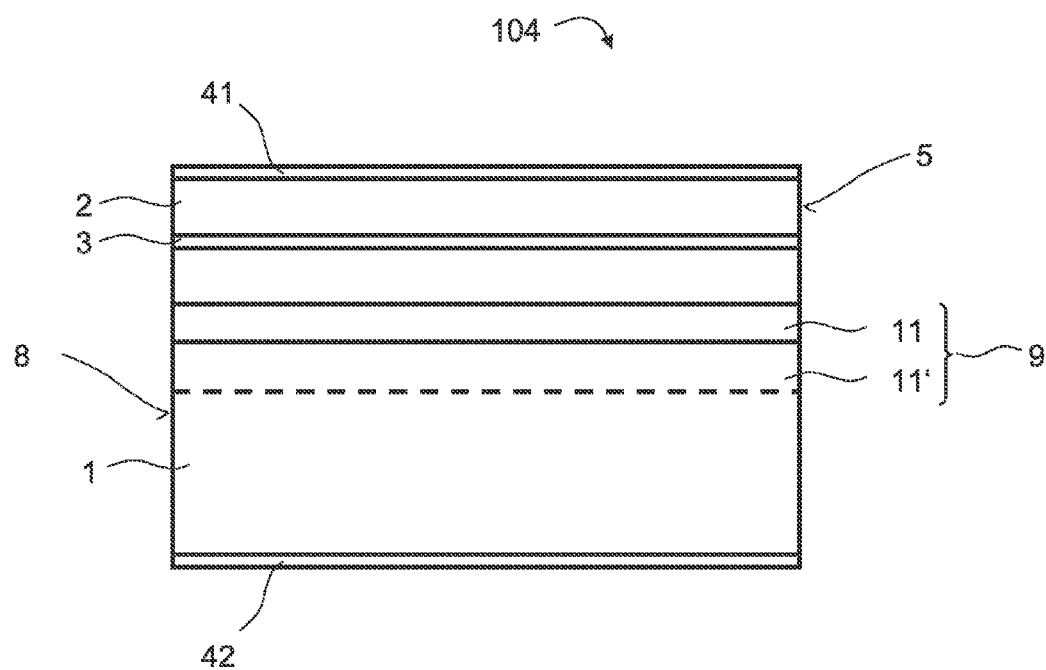

FIG. 5 shows a semiconductor laser diode 104 in accordance with a further exemplary embodiment, comprising a filter layer 9 having at least one absorber layer 11 and, as an alternative thereto, also a further absorber layer 11' between the substrate 1 and the semiconductor layer sequence 2.

Figure 6:
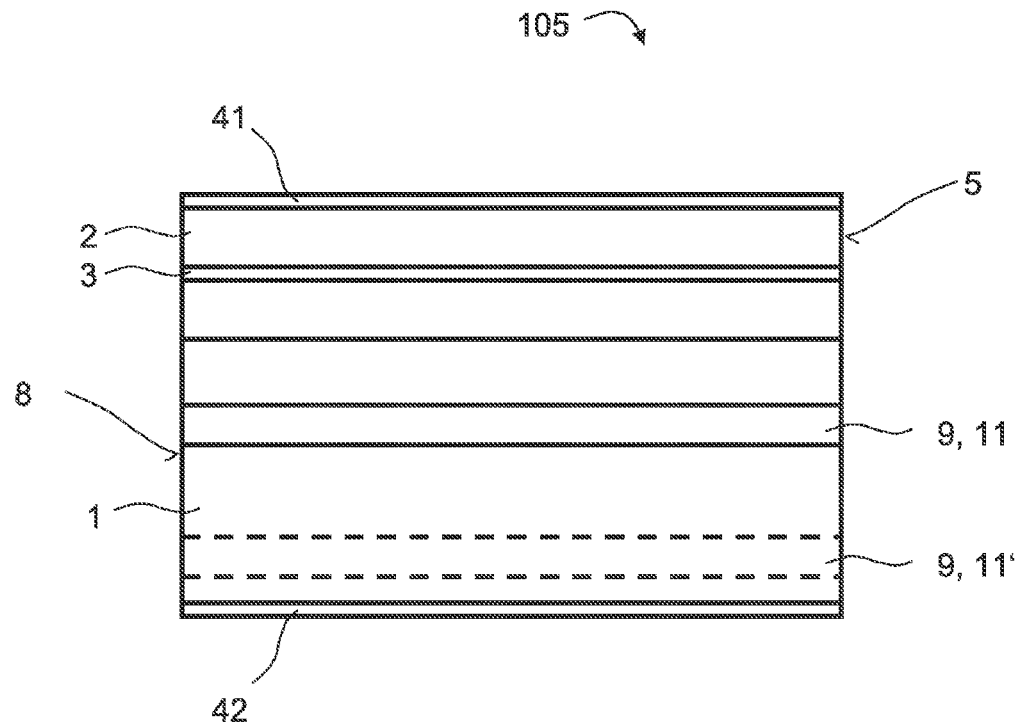

FIG. 6 shows a semiconductor laser diode 105 comprising at least one filter layer 9 having an absorber layer 11 and, as an alternative thereto, also a further filter layer 9 having an absorber layer 11' arranged in the substrate 1.

Figure 7:
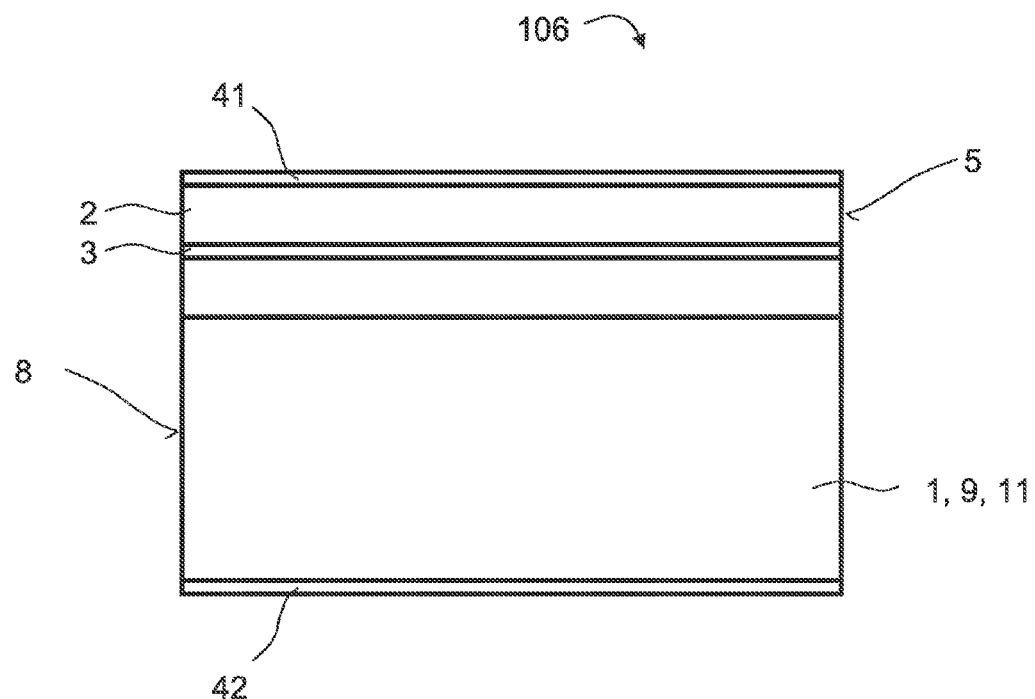

FIG. 7 shows a semiconductor laser diode 106 in accordance with a further exemplary embodiment, in which the substrate 1 is embodied as a filter layer 9 formed by an absorber layer 11. For this purpose, the substrate 1 can, for example, have an implantation of a material mentioned above or be formed by one of the absorbent materials mentioned above.

Figure 8:
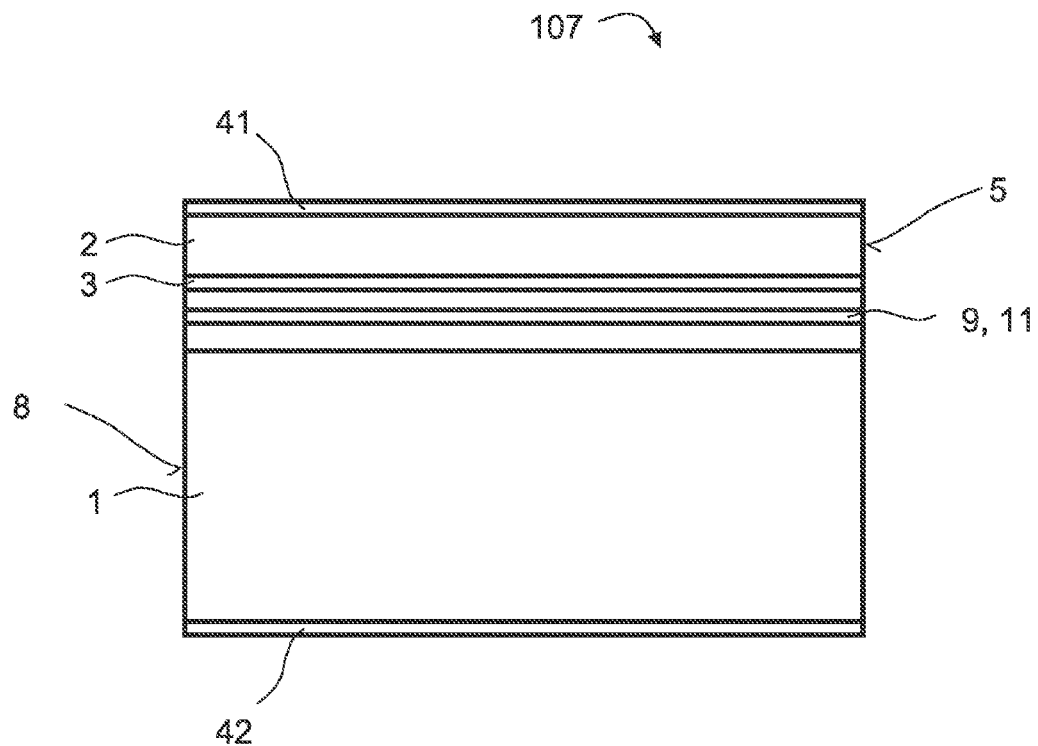
FIGS. 8 to 9C show schematic illustrations of semiconductor laser diodes in accordance with further exemplary embodiments.

FIG. 8 shows a semiconductor laser diode 107 in accordance with a further exemplary embodiment, in which a filter layer 9, formed by an absorber layer 11, is arranged in the semiconductor layer sequence 2 between the active layer 3 and the substrate 1. It is particularly advantageous if, in this case, the absorber layer 11 is formed by an InGaN layer between a cladding layer, an n-doped cladding layer according to the position in the semiconductor layer sequence 2, and the substrate 1.

Figure 9A:
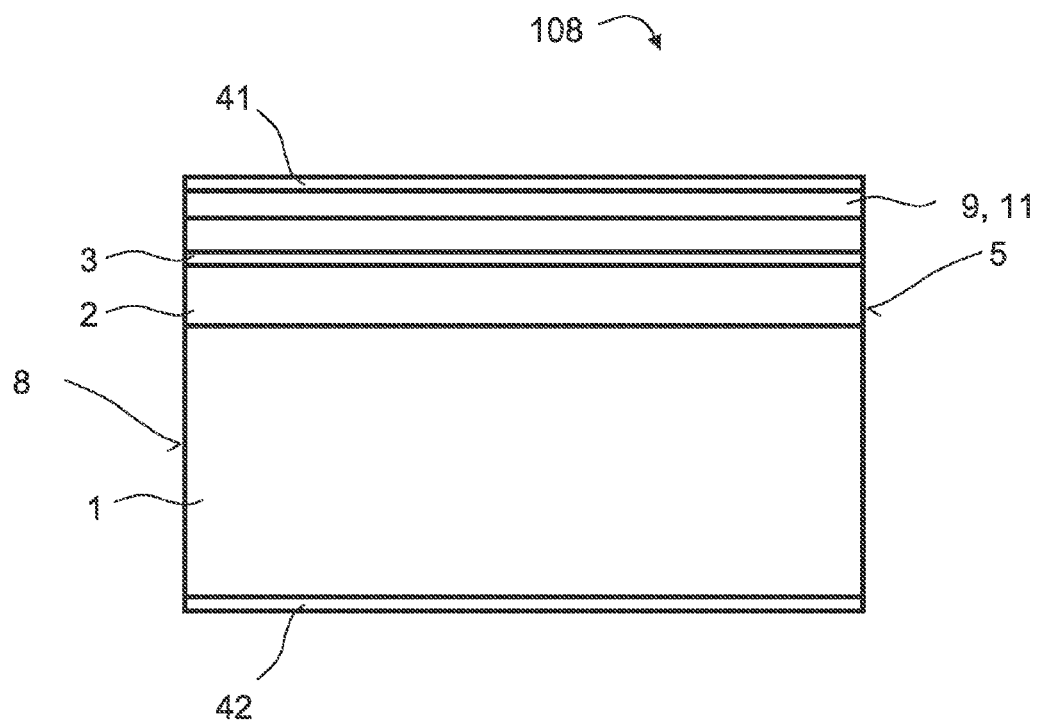
Figure 9B:
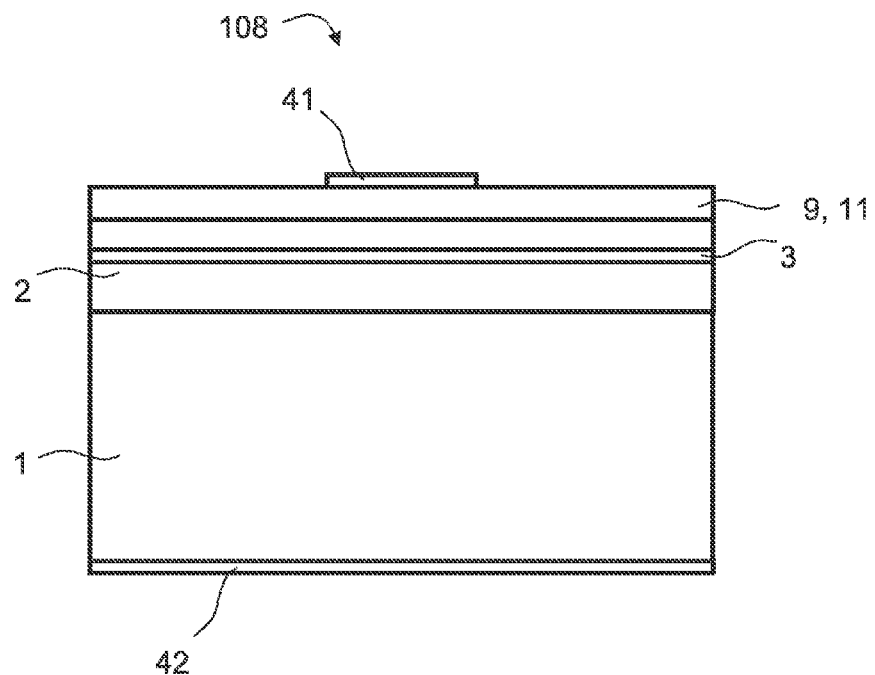
Figure 9C:
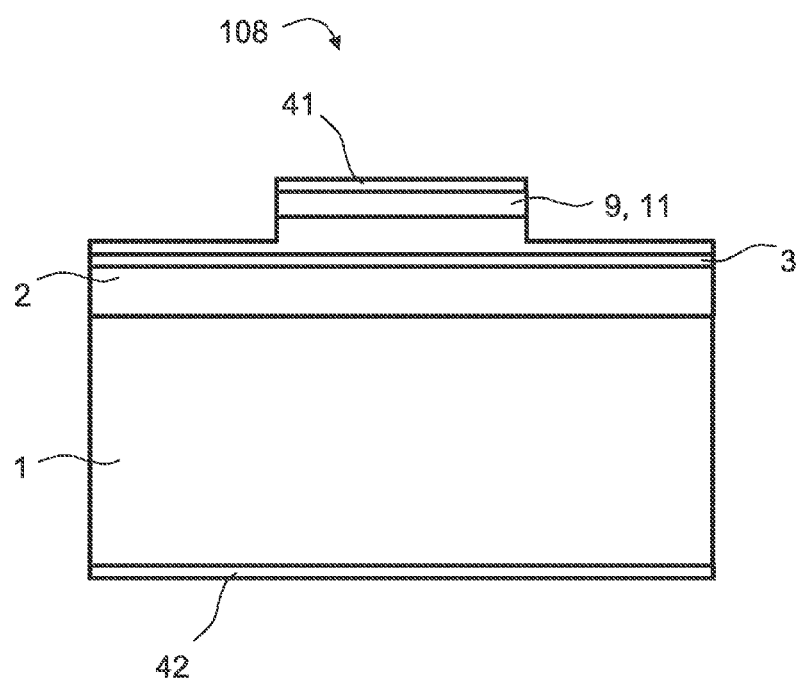

FIGS. 9A to 9C show a semiconductor laser diode 108 in accordance with further exemplary embodiments, in which a filter layer 9, formed by an absorber layer 11, is arranged in the semiconductor layer sequence 2 on that side of the active layer 3 which faces away from the substrate 1. In this case, FIG. 9A shows a sectional illustration in accordance with the depiction in FIG. 1B, while FIGS. 9B and 9C show sectional illustrations through the semiconductor laser diode 108 perpendicular to the emission direction 50.

In particular, the filter layer 9 can be arranged on the semiconductor layer sequence 2 and can be formed by an indium tin oxide layer and/or a tin oxide layer. In this case, it can also be possible that the electrode layer 41 is formed by the filter layer 9.

The filter layer 9 can be applied, as is shown in FIG. 9B, in large-area fashion on the semiconductor layer sequence 2 or, as is shown in FIG. 9C, in structured fashion only on a region of the semiconductor layer sequence 2 which is embodied in a ridge-shaped fashion.

Figure 10:
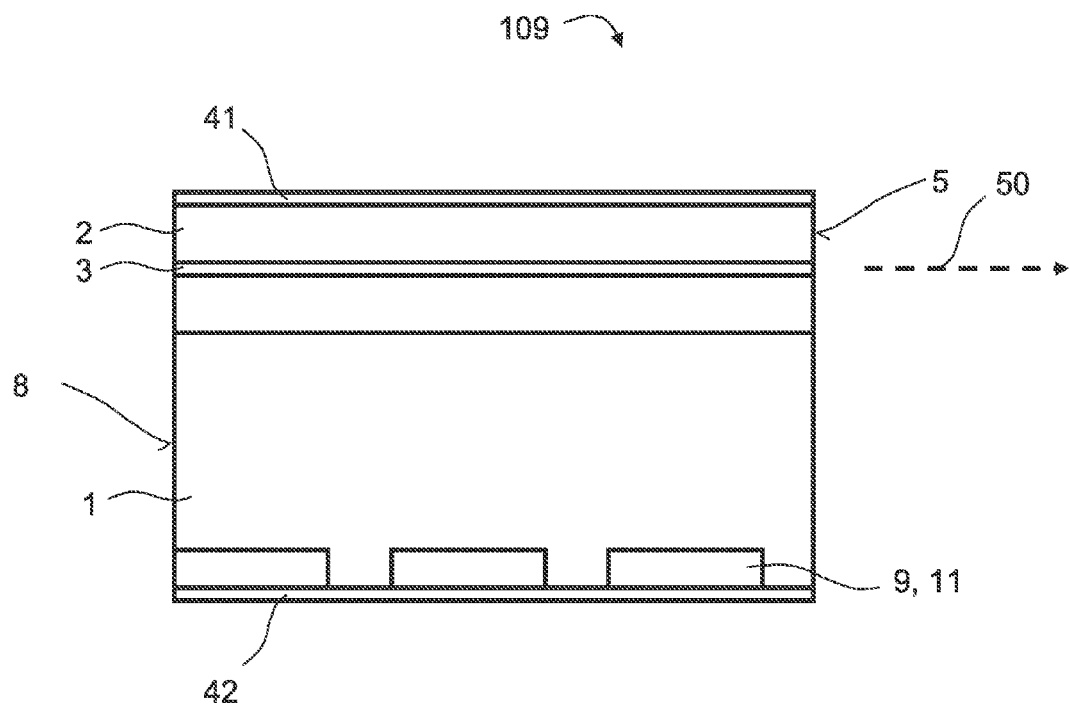
FIGS. 10 to 15 show schematic illustrations of semiconductor laser diodes in accordance with further exemplary embodiments.

FIG. 10 shows a semiconductor laser diode 109 in accordance with a further exemplary embodiment, in which the filter layer 9, which is arranged purely by way of example on the underside of the substrate facing away from the semiconductor layer sequence 2, is embodied in structured fashion and has partial regions separated from one another along the emission direction 50. The structured absorber layers shown in FIG. 10 and in the following figures can be advantageous in particular if an electrically insulating or a poorly electrically conducting material is used as absorber material, wherein such a structuring can also be used in the case of electrically conducting absorber materials.

Figure 11:
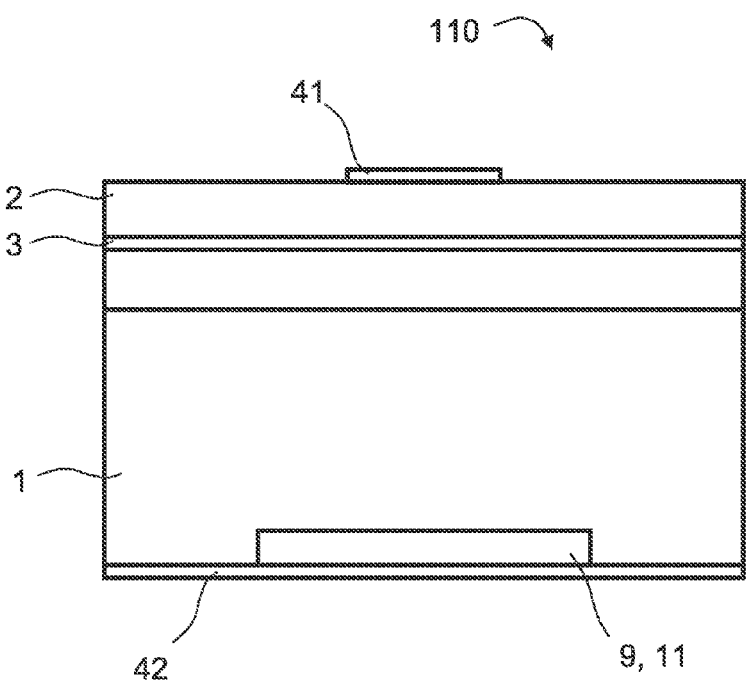

FIG. 11 shows a semiconductor laser diode 110 in accordance with a further exemplary embodiment in a sectional illustration perpendicular to the emission direction 50, in which the filter layer 9 is formed by an absorber layer 11 which is structured in a direction perpendicular to the emission direction. In this case, the absorber layer 11 is formed as a region which is arranged in a manner spaced apart from the side faces of the semiconductor laser diode 110 and is situated in particular below the active region of the active layer 3.

As an alternative to the exemplary embodiments in FIGS. 10 and 11, the absorber layers can also be arranged at other positions in the semiconductor layer sequence 2 or on or in the substrate 1, as is shown in part in FIGS. 12 to 15.

Figure 12:
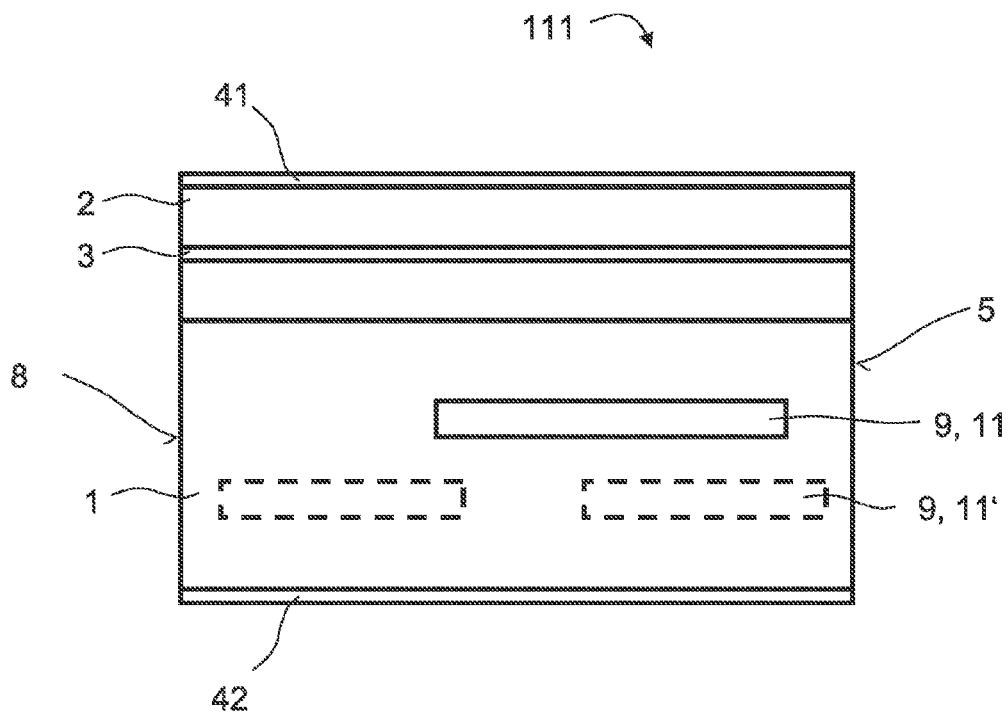

In this regard, by way of example, FIG. 12 shows a semiconductor laser diode 111 in accordance with a further exemplary embodiment, comprising a filter layer 9 formed by a partial, structured absorber layer 11 along the emission direction 50. Furthermore, a further filter layer 9 can be present, as is indicated in FIG. 12, which has, for example, a structured absorber layer 11' which is structured into partial regions arranged in a manner offset with respect to the absorber layer 11.

Figure 13:
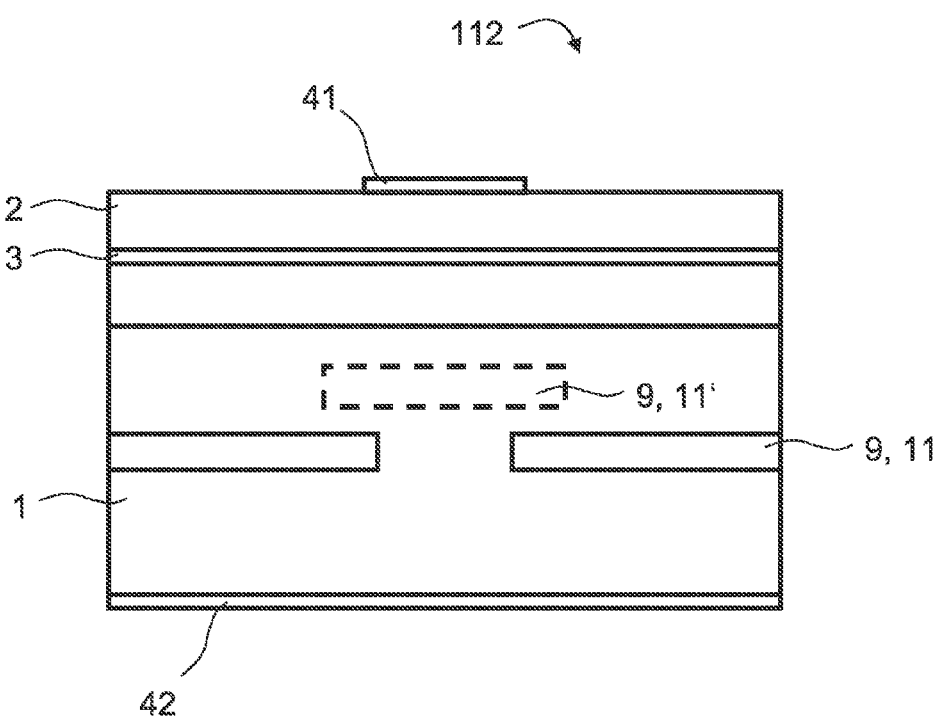

FIG. 13 shows a semiconductor laser diode 112 in accordance with a further exemplary embodiment, comprising one or a plurality of filter layers 9 having absorber layers 11, 11' in the substrate 1, which are structured in a direction perpendicular to the emission direction and which have partial regions arranged in a manner offset to one another.

Figure 14:
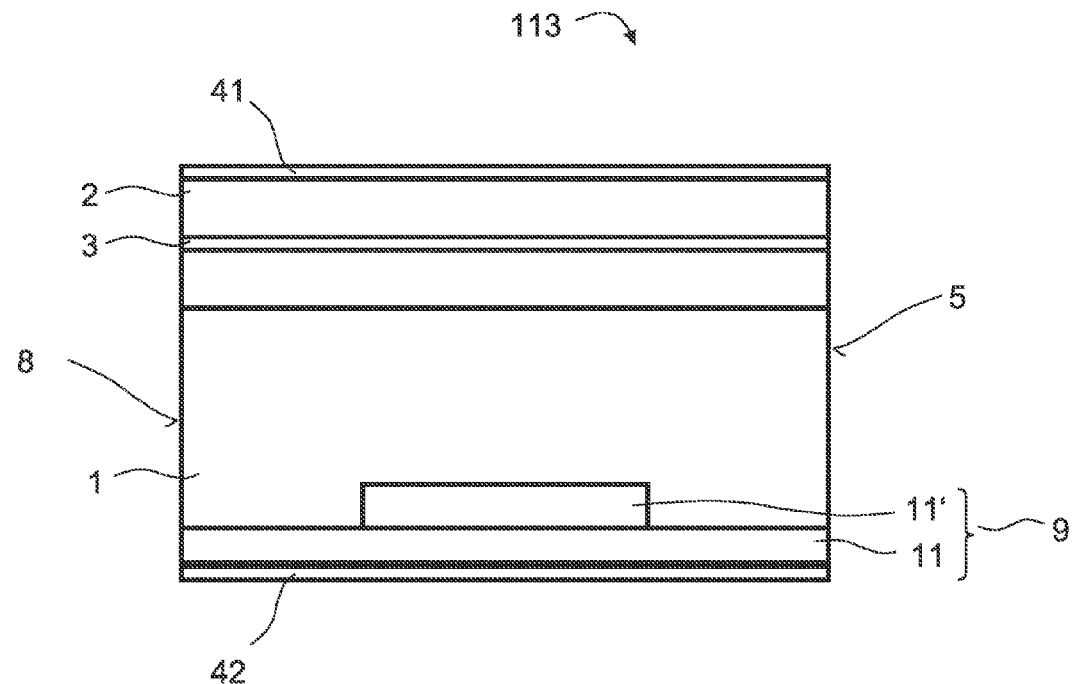
Figure 15:
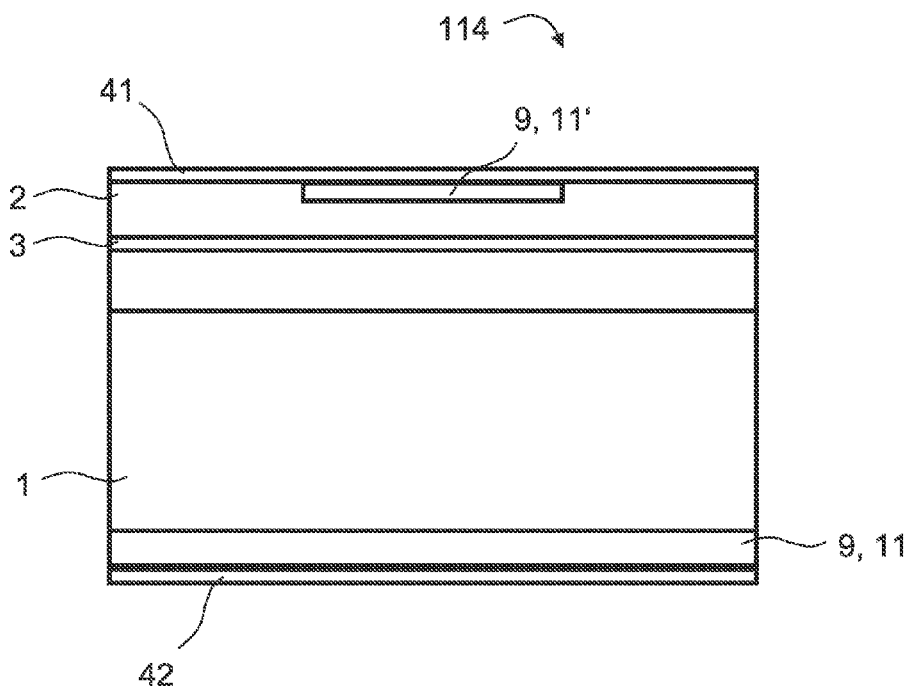

FIGS. 14 and 15 show semiconductor laser diodes 113, 114 comprising a filter layer 9 having two absorber layers 11, 11' in the case of FIG. 14 and two filter layers each having an absorber layer 11, 11' in the case of FIG. 15, wherein the absorber layer 11 is embodied in each case as unstructured and in large-area fashion and the absorber layer 11' is in each case structured.

By means of the filter layers described here, the substrate mode can be significantly reduced; by way of example, it is possible to prevent back-reflections at the n-type metallizations formed by the electrode layer, as a result of which the disturbing substrate light emission can be greatly reduced. As a result, the image quality is significantly increased when the semiconductor laser diodes shown are used in projection applications. By virtue of the integration of the at least one filter layer into the semiconductor laser diode, no external diaphragms, absorbent elements or the like are required, which can considerably reduce the assembly outlay and the assembly tolerance and can reduce the design size and thus facilitate integration into a projector.

In addition to the measures shown for suppressing the substrate mode, the semiconductor laser diodes described here can for example also comprise a light blocking layer on the front facet, as described in the German Patent Application DE 10 2011 054 954.4 and U.S. Provisional Application No. 61/590,375, the respective disclosure content of which with regard to the light blocking layer is hereby expressly incorporated by reference. At least part of the front facet can be covered by the light blocking layer described in the patent applications cited. Multiple reflections which would emerge from the front facet past the light blocking layer can be prevented by the filter layer described here.

The exemplary embodiments shown in the figures can also be combined with one another and/or can additionally or alternatively comprise further features in accordance with the description in the general part, even if such combinations are not explicitly shown in the figures.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

What is claimed is:

1. A semiconductor laser diode, comprising:
   a substrate;
   a semiconductor layer sequence on the substrate, the layer sequence having an active layer designed for generating laser light that is emitted along an emission direction during operation; and
   a filter layer that has a main extension plane that is parallel to a main extension plane of the active layer and that is designed to scatter and/or absorb light that propagates in the semiconductor layer sequence and/or the substrate in addition to the laser light, wherein the filter layer has a roughening on an opposite side of the substrate relative to the semiconductor layer sequence and an absorber layer on the roughening.

2. The semiconductor laser diode according to claim 1, wherein the roughening has a mean roughness of greater than or equal to 1 nm and less than or equal to 30 μm.

3. A semiconductor laser diode, comprising:
   a substrate;

a semiconductor layer sequence on the substrate, the layer sequence having an active layer designed for generating laser light that is emitted along an emission direction during operation; and a filter layer that has a main extension plane that is parallel to a main extension plane of the active layer and that is designed to scatter and/or absorb light that propagates in the semiconductor layer sequence and/or the substrate in addition to the laser light, wherein the filter layer has a roughening and an absorber layer adjacent the roughening.

4. The semiconductor laser diode according to claim 3, wherein the absorber layer is applied on an opposite side of the substrate relative to the semiconductor layer sequence, within the substrate and/or between the substrate and the semiconductor layer sequence.

5. The semiconductor laser diode according to claim 3, wherein the absorber layer is arranged in the semiconductor layer sequence between the substrate and the active layer.

6. The semiconductor laser diode according to claim 3, wherein the absorber layer is arranged in the semiconductor layer sequence on the opposite side of the active layer relative to the substrate.

7. The semiconductor laser diode according to claim 3, wherein the substrate is embodied as the absorber layer.

8. The semiconductor laser diode according to claim 3, wherein at least two absorber layers are present.

9. The semiconductor laser diode according to claim 8, wherein the at least two absorber layers are embodied differently.

10. The semiconductor laser diode according to claim 3, wherein the absorber layer is structured in a direction along the emission direction and/or perpendicular to the emission direction.

11. The semiconductor laser diode according to claim 10, wherein at least two absorber layers structured into partial regions are present and wherein the partial regions are arranged in a manner offset with respect to one another.

12. The semiconductor laser diode according to claim 3, wherein the absorber layer is arranged in a maximum of a substrate mode.

13. The semiconductor laser diode according to claim 3, wherein the absorber layer has an absorption coefficient of greater than or equal to 100 cm$^{-1}$.

14. The semiconductor laser diode according to claim 3, wherein the absorber layer has a thickness of greater than or equal to 1 nm and less than or equal to 200 μm.

15. The semiconductor laser diode according to claim 3, wherein the absorber layer has a refractive index greater than or equal to 70% of the refractive index of the substrate.

16. The semiconductor laser diode according to claim 3, wherein a material is introduced by diffusion or implantation for forming the absorber layer, the material comprising one or more materials selected from the group consisting of N, P, O, Mg, Si, Ge, B, and H.

17. The semiconductor laser diode according to claim 3, wherein the absorber layer is grown epitaxially with one or more materials selected from the group consisting of AlInGaN, AlInGaAs, AlInGaP, Si, Ge, ZrO, ZnO, ZnSe, and CdTe.

18. The semiconductor laser diode according to claim 3, wherein the absorber layer comprises a material applied by vapor deposition, sputtering, chemical vapor deposition, ion plating and/or atomic layer deposition, the material selected from the group consisting of AlInGaN, Si, Ge, indium tin oxide, Ni, Cr, Ti, Nb, Pd, Pt, Au, Ag, Cu, Al, ZnO, and TiWN.

* * * * *